Sept. 2, 1958 G. ELLIOTT 2,850,648

PULSE GENERATING CIRCUIT

Filed March 18, 1955

*INVENTOR.*
GEORGE ELLIOTT
*BY* F. H. Henson
*AGENT*

2,850,648
Patented Sept. 2, 1958

2,850,648

PULSE GENERATING CIRCUIT

George Elliott, Rochester, N. Y., assignor, by mesne assignments, to General Dynamics Corporation, a corporation of Delaware Application March 18, 1955, Serial No. 495,277

4 Claims. (Cl. 307—88.5)

Figure 1:
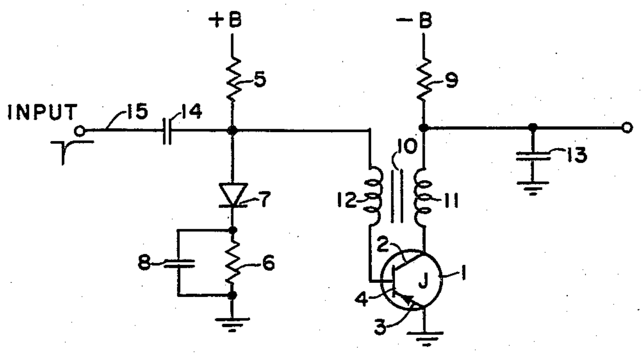

This invention relates in general to pulse generating circuits, and more particularly to transistor blocking oscillator circuits.

A transistor blocking oscillator has many applications. For example, the transistor blocking oscillator circuits herein disclosed are also shown and described in conjunction with an electronic telephone system which forms the subject matter of my copending application, Serial No. 492,069, filed March 4, 1955, and assigned to the same assignee as the present invention.

As used in one application in the telephone system disclosed in the above-identified application, the transistor blocking oscillator circuit controls the firing of gas tubes which apply ringing voltage to the selected called line. The output pulse produced by transistor blocking oscillators, prior to this invention, was not of sufficient amplitude or duration to positively fire a gas tube. Of course, there are many other applications where it is desirable to have an output pulse of high amplitude and relatively long duration.

Accordingly, it is the general object of this invention to provide a new and improved transistor blocking oscillator circuit.

It is a more particular object of this invention to provide a new and improved transistor blocking oscillator circuit which will produce an output pulse having high amplitude and which is of relatively long duration.

The invention accomplishees the above cited objects by providing a blocking oscillator circuit in which capacitive means is effectively connected to and disconnected from the base of the transistor at different times during the cycle of operation by the action of a crystal diode. The crystal diode is poled so as to be rendered non-conductive by the trigger pulse which initiates the operation of the blocking oscillator so that the trigger pulse may be transmitted in full to the base electrode. The diode, or unidirectional conducting means, is rendered conductive by voltage regeneratively coupled into the base circuit from the collector circuit so that the capacitive means may be utilized as a low impedance return for the base circuit current and also to maintain the transistor in a saturated condition for the charge time of the capacitive means.

Further objects and advantages of the invention will become apparent as the description proceeds and the features of novelty which characterize the invention will be pointed out in particularity in the claims annexed to and forming a part of this specification.

Figure 2:
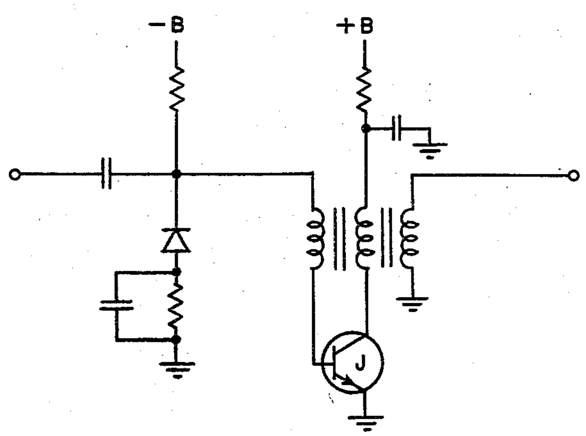

For a better understanding of the invention, reference may be had to the drawing in which:

Fig. 1 illustrates one embodiment of the invention in which a PNP junction transistor is used; and Fig. 2 illustrates a second embodiment of the invention in which an NPN junction transistor is used.

Referring to Fig. 1 of the drawing, it can be seen that the blocking oscillator comprises a PNP junction transistor 1, which may be type CK-721, having a collector 2, an emitter 3, and a base 4. The transistor is normally biased for non-conduction since the base is positive with respect to the emitter which is returned to a reference, or ground, potential. Base bias is derived from the voltage division across resistors 5 and 6 from current flow from a suitable source of positive potential, labeled +B, through resistor 5, the forward impedance of crystal diode 7, and through resistor 6 to ground. Capacitive means 8, which is connected in parallel with resistor 6, is, of course, charged to the potential developed across resistor 6. The collector 2 is returned to a suitable source of negative potential, labeled —B, through resistor 9 and primary winding 11 of transformer 10.

The transistor 1 may be rendered conductive by the application of a negative pulse to the input conductor 15 or by the negative spike of an input pulse differentiated by capacitor 14 and resistor 5. The negative going trigger pulse is coupled through secondary winding 12 of transformer 10 to the base 4. Since the trigger pulse is negative, crystal diode 7 is rendered non-conductive so that the low impedance of capacitor 8 to ground is effectively disconnected from in parallel with the base-to-emitter impedance of transistor 1 so that the trigger pulse may be transmitted in full to the base 4. When the oscillator responds by firing, the voltage rise in primary winding 11 is reflected into secondary winding 12 in such direction so as to make the base terminal 4 of transistor 1 more negative and thus assist in the build-up to saturation. Crystal diode 7, which is connected to the other terminal of winding 12, is, of course, rendered conductive and a heavy base current flows from ground through capacitor 8, diode 7, winding 12, and through the base 4 and emitter 3 of the transistor back to ground. This current decreases exponentially as capacitor 8 is charged so that the transistor is held saturated for a time period determined by the capacity of capacitor 8. The inductance of transformer 10 is sufficiently large that the pulse duration is controlled solely by the capacitor 8 and not by saturation effects in the transformer. During this period, the collector voltage, normally at —B, stands substantially at ground potential. When the base current decreases sufficiently to bring the transistor out of saturation, the collector voltage rises once more and transformer winding 11 reflects this change into the base winding 12 in such a direction as to make the base terminal more positive and thus further cut off the transistor. Thus, a collector pulse having a steep front, an essentially flat top, and a steep trailing edge is produced. As shown, the output pulse is taken from across collector load resistor 9 and coupled to succeeding circuits. Capacitor 13 serves to de-couple transient signals from potential source —B.

Fig. 2 illustrates the reversal of voltages and the connection of the crystal diode necessary when an NPN junction transistor, such as type TI-201, is used. It is to be noted that the base is made negative with respect to the emitter for non-conduction, and that the transistor is rendered conductive by positive going trigger pulses. The crystal diode is rendered non-conductive by positive trigger pulses so that a high input impedance is seen by the trigger pulse, as was the case with negative pulses in the circuit of Figure 1. The secondary winding of the pulse transformer is connected such that the base is made more positive and the crystal diode is rendered conductive responsive to an increase of current in the collector circuit.

While there has been disclosed what is at present considered to be the preferred embodiments of the invention, other modifications will readily occur to those skilled in the art. It is not, therefore, desired that the invention be limited to the specific arrangements shown and described, and it is intended to cover in the appended claims all such modifications as fall within the true spirit and scope of the invention.

What is claimed is:

1. A pulse generating circuit comprising a transistor having a base, an emitter, and a collector, a source of potential having first and second terminals, means for connecting said emitter to said first terminal, unidirectional conducting means connected in series with the parallel combination of a first impedance element and capacitive means between said base and said first terminal, a second impedance element connected between said base and said second terminal, said unidirectional conducting means being poled so as to normally permit current flow between said first and second terminals to bias said transistor for non-conduction and to charge said capacitive means, means for coupling a trigger pulse to said base to render said transistor conductive and to render said unidirectional conducting means non-conductive, means for coupling said collector to said base in such manner that voltage induced in the base circuit by an increase of current in the collector circuit aids the build-up to saturation of the transistor and also renders said unidirectional conducting means conductive, whereby the duration of base circuit current flow is controlled by said capacitive means.

2. A pulse generating circuit comprising a transistor having base, emitter, and collector electrodes, a source of potential having first and second terminals, means for connecting said emitter to the first terminal of said source of potential, means for regeneratively coupling said collector electrode to said base electrode, said last named means comprising a transformer having a first winding connected in circuit with said collector electrode and a second winding having a first terminal connected to said base electrode, a unidirectional conducting device, first and second impedance elements, a capacitor, means for connecting said device in series with the parallel combination of said first impedance element and said capacitor between the second terminal of said secondary winding and the first terminal of said source of potential, means for connecting said second impedance element between the second terminal of said secondary winding and the second terminal of said source of potential, said unidirectional conducting device being poled so as to normally permit current flow between the first and second terminals of said source of potential to bias said transistor for non-conduction and to charge said capacitor, and means for coupling trigger pulses to the second terminal of said secondary winding.

3. A pulse generating circuit comprising a transistor having a base, an emitter, and a collector, a source of potential having first and second terminals, said second terminal being positive with respect to said first terminal, means for connecting said emitter to said first terminal, a unidirectional conducting device having an anode terminal and a cathode terminal, means for connecting the anode terminal of said device to said base, first and second impedance elements, a capacitor means for connecting said first impedance element and said capacitor in parallel between the cathode terminal of said device and said first terminal, means for connecting said second impedance element between said base and said second terminal whereby said device is normally conductive and said capacitor is charged, means for applying a trigger pulse to said base to render said transistor conductive and said device non-conductive, and means for coupling said collector to said base in such manner that voltage induced in the base circuit by an increase of current in said collector circuit aids the build up to saturation of the transistor and also renders said device conductive, whereby the duration of base circuit current flow is controlled by the discharge time of said capacitor.

4. A pulse generating circuit comprising a transistor having a base, an emitter, and a collector, a source of potential having first and second terminals, said second terminal being negative with respect to said first terminal, means for connecting said emitter to said first terminal, a unidirectional conducting device having an anode terminal, and a cathode terminal, means for connecting the cathode terminal of said device to said base, first and second impedance elements, a capacitor, means for connecting said first impedance element and said capacitor in parallel between the anode terminal of said device and said first terminal, means for connecting said second impedance element between said base and said second terminal whereby said device is normally conductive and said capacitor is charged, means for applying a trigger pulse to said base to render said transistor conductive and said device non-conductive, and means for coupling said collector to said base in such manner that voltage induced in the base circuit by an increase of current in said collector circuit aids the build up to saturation of the transistor and also renders said device conductive, whereby the duration of base circuit current flow is controlled by the discharge time of said capacitor.

References Cited in the file of this patent

UNITED STATES PATENTS

| | | |
|---|---|---|
| 2,193,850 | Andrieu et al. | Mar. 19, 1940 |
| 2,703,368 | Wrathall | Mar. 1, 1955 |

FOREIGN PATENTS

| | | |
|---|---|---|
| 144,789 | Australia | Jan. 17, 1952 |

OTHER REFERENCES

Wireless Engineer, May 1955, "Junction-Transistor Trigger Circuits" by J. E. Flood, pp. 128–130.